(12) United States Patent  (10) Patent No.: US 8,669,596 B2
Tamaru  (45) Date of Patent: Mar. 11, 2014

(54) SEMICONDUCTOR DEVICE

(75) Inventor: Masaki Tamaru, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/560,230

(22) Filed: Jul. 27, 2012

(65) Prior Publication Data

US 2012/0292666 A1  Nov. 22, 2012

Related U.S. Application Data

(63) Continuation of application No. PCT/JP2011/000165, filed on Jan. 14, 2011.

(30) Foreign Application Priority Data

Mar. 5, 2010 (JP) ................................. 2010-049052

(51) Int. Cl.
 *H01L 27/10* (2006.01)
(52) U.S. Cl.
 USPC .................................. 257/206; 257/E27.062
(58) Field of Classification Search
 USPC ........................... 257/204, 206, 210, E27.059
 See application file for complete search history.

(56) References Cited

U.S. PATENT DOCUMENTS

| 6,101,120 | A | 8/2000 | Ishida |
| 6,204,542 | B1 | 3/2001 | Kinoshita et al. |
| 6,691,297 | B1 | 2/2004 | Misaka et al. |
| 7,279,727 | B2 * | 10/2007 | Ikoma et al. ................... 257/204 |
| 7,956,421 | B2 * | 6/2011 | Becker .......................... 257/369 |
| 2007/0004147 | A1 | 1/2007 | Toubou et al. |
| 2008/0224176 | A1 | 9/2008 | Nakanishi et al. |
| 2008/0250383 | A1 | 10/2008 | Tanaka et al. |
| 2010/0044755 | A1 | 2/2010 | Tsuda et al. |

FOREIGN PATENT DOCUMENTS

| JP | 05-251671 A | 9/1993 |
| JP | 2007-12855 | 1/2007 |
| JP | 2008-235350 | 10/2008 |
| JP | 4301462 | 5/2009 |

OTHER PUBLICATIONS

International Search Report issued in International Patent Application No. PCT/JP/2011/000165 dated Feb. 15, 2011.

* cited by examiner

*Primary Examiner* — Chandra Chaudhari

(74) *Attorney, Agent, or Firm* — McDermott Will & Emery LLP

(57) ABSTRACT

In end portions of first and second gate patterns aligned in parallel relation to each other, and opposite end portions of third and fourth gate patterns aligned in parallel relation to each other, the end portion of the first gate pattern extends to be positioned closer to the third and fourth gate patterns than the end portion of the second gate pattern is, and the opposite end portion of the fourth gate pattern extends to be positioned closer to the first and second gate patterns than the opposite end portion of the third gate pattern is.

15 Claims, 7 Drawing Sheets

GATE  SOURCE/DRAIN DIFFUSION REGION  DUMMY GATE

FIG.1A
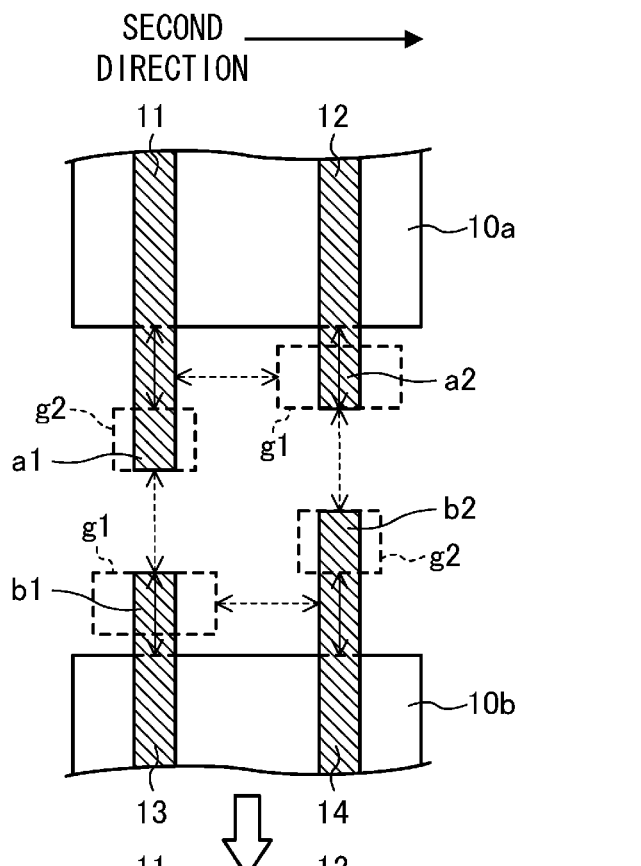
FIG.1B
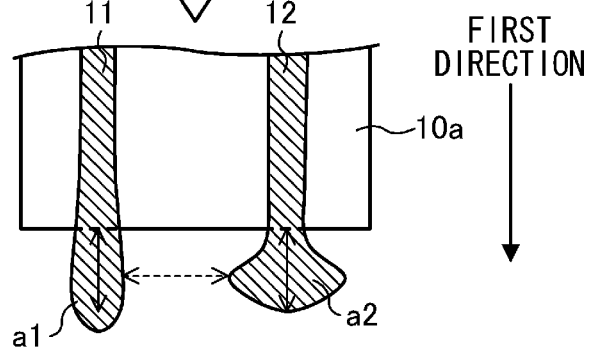
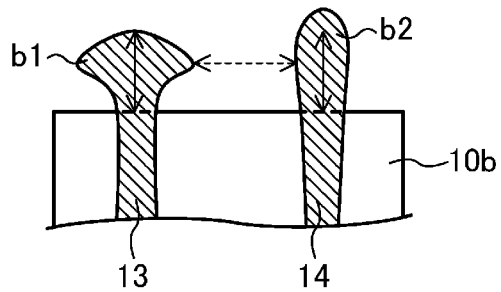

SEMICONDUCTOR DEVICE

CROSS-REFERENCE TO RELATED APPLICATION

This is a continuation of PCT International Application PCT/JP2011/000165 filed on Jan. 14, 2011, which claims priority to Japanese Patent Application No. 2010-049052 filed on Mar. 5, 2010. The disclosures of these applications including the specifications, the drawings, and the claims are hereby incorporated by reference in their entirety.

BACKGROUND

The present disclosure relates to semiconductor devices, and more particularly to layouts of gate patterns.

In general, in processes for fabricating semiconductor devices, a photolithography step including application of a resist, light exposure, and development, an etching step of patterning elements using a resist mask, and a step of removing the resist are repeated to form an integrated circuit on a semiconductor substrate. In recent years, with increasing miniaturization of semiconductor devices, pattern dimensions have been smaller than a wavelength of the exposure light in the photolithography step. Therefore, due to an optical proximity effect of diffracted light, differences between the designed layout dimensions and the pattern dimensions formed on the semiconductor substrate become disadvantageously large.

In order to reduce an optical proximity effect, conventional techniques have designed layouts, for example, a layout in which gate lengths and gate spaces are limited to one or several optional values. The layouts can maintain the finished measurements of the gate lengths to be constant, resulting in reducing variations of the gate lengths due to an optical proximity effect (see Japanese Patent Publication 2007-12855).

Also, Japanese Patent Publication 2008-235350 (FIGS. 1 and 18) shows designing a layout, such as, a layout which maintains not only a regularity of shapes of gate patterns aligned in the horizontal direction of a target gate, but also a regularity of shapes of gate patterns aligned in the vertical direction of the target gate.

SUMMARY

Nowadays, it becomes essential to correct variations in pattern dimensions caused by the optical proximity effect stated above. Examples of the techniques for correcting the optical proximity effect include an Optical Proximity effect Correction (OPC). The OPC is a technique in which an amount of change in the gate length and the gate width due to an optical proximity effect is predicted from a distance between a gate and its adjacent gate pattern, and the mask measurements of the photoresist for forming the gate are corrected beforehand to compensate the predicted amount of change.

When such correction technique is used, a layout with a higher area efficiency is not necessarily achieved. For example, when end portions of gate patterns aligned in parallel relation to one another are provided with large correction amounts to prevent the end portion from moving back, the end portion is wider by the correction amount, resulting in contacting its adjacent gate pattern. In other words, it was difficult for conventional techniques to correct the optical proximity effect while placing gate patterns at a higher area efficiency.

It is an objective of the present invention to devise layouts of the gate patterns in a semiconductor device having gate patterns in parallel relation to one another, thereby correcting an optical proximity effect while more significantly improving integration density of the device than that of conventional devices.

A semiconductor device according to a first aspect of the present invention includes a first gate group in which a plurality of gate patterns extending in a first direction are arranged in a second direction orthogonal to the first direction, and a plurality of opposite end portions of gate patterns arranged to face end portions of the respective gate patterns of the first gate group, wherein end pairs, each of which includes the end portion and the opposite end portion facing the end portion, are arranged in a staggered manner in the second direction.

According to the first aspect, the end pairs, each of which includes the end portion of the gate pattern of the first gate group and the opposite end portion of another gate pattern facing the end portion, are aligned in a staggered manner in the second direction in which the gate patterns are aligned. Therefore, of the end portions of the respective gate patterns in the first gate group, the end portion extending to be positioned farther from other gate patterns can be set to have a larger correction amount so that the end portions in the finished shape do not significantly move back. With this structure, a short circuit of adjoining gate patterns does not occur, and a space between the end portion and the opposite end portion can be narrower, thereby making it possible to improve integration density of the semiconductor device. If the same circuit area is used, a larger transistor active region can be ensured.

A semiconductor device according to a second aspect of the present invention includes a first gate group in which a plurality of gate patterns extending in a first direction are aligned in a second direction orthogonal to the first direction, and a plurality of opposite end portions arranged to face end portions of the respective gate patterns of the first gate group, wherein of the end portions of the respective gate patterns in the first gate group, thicker ones and thinner ones are alternately formed, and of the opposite end portions, the opposite end portion facing the thicker end portion is formed to be thinner, and the opposite end portion facing the thinner end portion is formed to be thicker.

According to the second aspect, of the end portions of the respective gate patterns in the first gate group, thicker ones and thinner ones are alternately formed. In other words, every other end portion in the respective gate patterns of the first gate group is set to have a larger correction amount so that the end portions in the finished shape do not significantly move back. With this structure, a short circuit of adjoining gate patterns does not occur, and a space between the end portion and the opposite end portion can be narrower, thereby making it possible to improve integration density of the semiconductor device. If the same circuit area is used, a larger transistor active region can be ensured.

A semiconductor device according to a third aspect of the present invention includes first and second gate patterns extending in a first direction and aligned in a second direction orthogonal to the first direction, and third and fourth gate patterns extending in the first direction, aligned in the second direction, and having opposite end portions arranged to face end portions of the first and second gate patterns, respectively, wherein the end portion of the first gate pattern extends to be positioned closer to the third and fourth gate patterns than the end portion of the second gate pattern is, and the opposite end portion of the fourth gate pattern extends to be positioned closer to the first and second gate patterns than the opposite end portion of the third gate pattern is.

According to the third aspect, in the end portions of the first and second gate patterns aligned in parallel relation to each other, and the opposite end portions of the third and fourth gate patterns aligned in parallel relation to each other, the end portion of the first gate pattern extends to be positioned closer to the third and fourth gate patterns than the end portion of the second gate pattern is, and the opposite end portion of the fourth gate pattern extends to be positioned closer to the first and second gate patterns than the opposite end portion of the third gate pattern is. Therefore, the end portion of the second gate pattern extending to be positioned farther from the third and fourth gate patterns, and the opposite end portion the third gate pattern extending to be positioned farther from the first and second gate patterns can be set to have a larger correction amount so that the end portion and the opposite end portion in the finished shape do not significantly move back. With this structure, a short circuit of adjoining gate patterns does not occur, and a space between the end portion and the opposite end portion can be narrower, thereby making it possible to improve integration density of the semiconductor device. If the same circuit area is used, a larger transistor active region can be ensured.

A semiconductor device according to a fourth aspect of the present invention includes first and second gate patterns extending in a first direction and aligned in a second direction orthogonal to the first direction, and third and fourth gate patterns extending in the first direction, aligned in the second direction, and having opposite end portions arranged to face end portions of the first and second gate patterns, respectively, wherein the end portion of the second gate pattern is formed to be thicker than the end portion of the first gate pattern, and the opposite end portion of the third gate pattern is formed to be thicker than the opposite end portion of the fourth gate pattern.

According to the fourth aspect, in the end portions of the first and second gate patterns aligned in parallel relation to each other, and the opposite end portions of the third and fourth gate patterns aligned in parallel relation to each other, the end portion of the second gate pattern is formed to be thicker than the end portion of the first gate pattern, and the opposite end portion of the third gate pattern is formed to be thicker than the opposite end portion of the fourth gate pattern. In other words, the end portion of the second gate pattern and the opposite end portion of the third gate pattern can be set to have a larger correction amount so that the end portion and the opposite end portion in the finished shape do not significantly move back. With this structure, a short circuit of adjoining gate patterns does not occur, and a space between the end portion and the opposite end portion can be narrower, thereby making it possible to improve integration density of the semiconductor device. If the same circuit area is used, a larger transistor active region can be ensured.

According to the present invention, integration density of a semiconductor device having gate patterns can be improved. A larger transistor active region can be ensured if the same circuit area is used, resulting in achieving extension of a gate width of a transistor and increase of a drive current of a transistor.

BRIEF DESCRIPTION OF THE DRAWINGS

FIGS. 1A and 1B are views showing characteristics of gate patterns in a semiconductor device according to a first embodiment.

DETAILED DESCRIPTION

Figure 2:
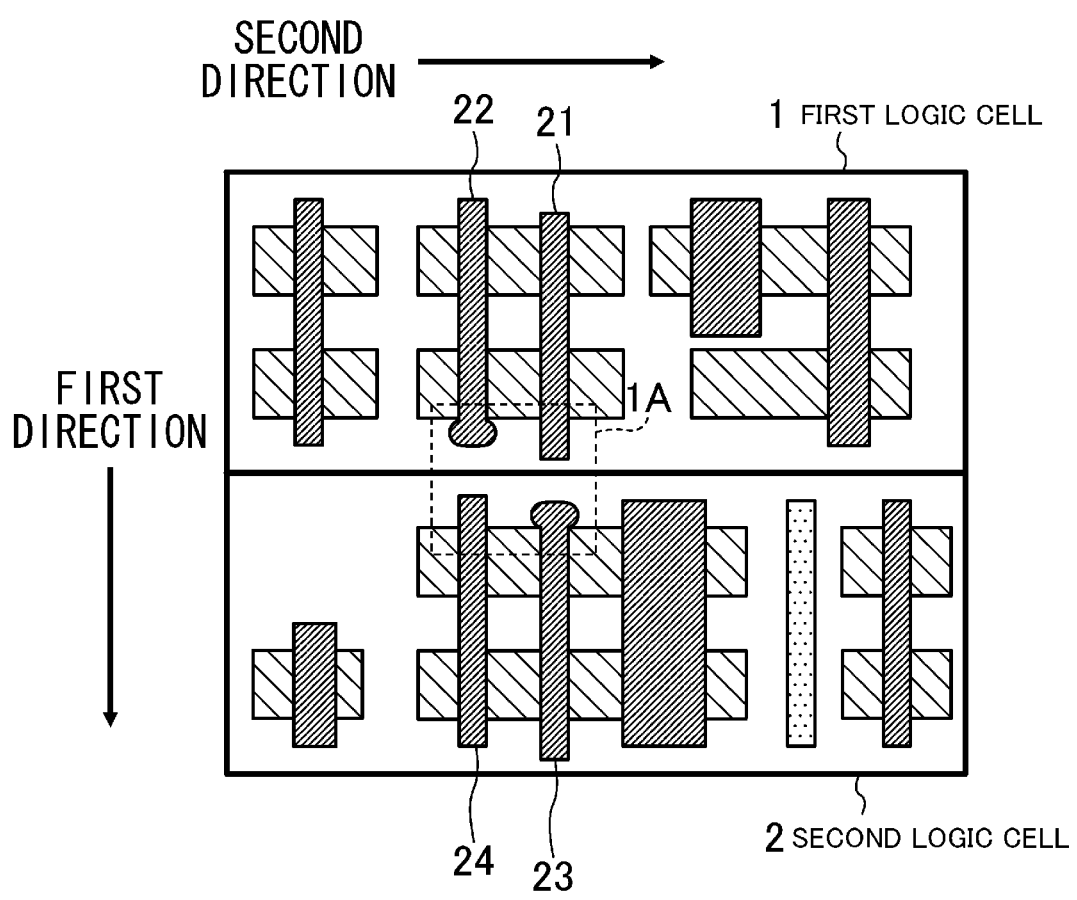
FIG. 2 is a view showing an example of layouts of the semiconductor device according to the first embodiment.

Embodiments of the present disclosure will be described in detail hereinafter with reference to the accompanying drawings.

First Embodiment

FIG. 1 is a view showing characteristics of gate patterns in a semiconductor device according to a first embodiment. In the figure, FIG. 1A shows a layout shape of the gate patterns, and FIG. 1B shows a finished shape of the gate patterns. In FIG. 1, a first gate pattern 11 and a second gate pattern 12 are arranged on an active region 10a, extend in a first direction (the vertical direction of the figure), and are aligned in a second direction (the horizontal direction of the figure) which is perpendicular to the first direction. A third gate pattern 13 and a fourth gate pattern 14 are arranged on an active region 10b, extend in the first direction, and are aligned in the second direction. End portions a1 and a2 of the first and second gate patterns 11 and 12 face opposite end portions b1 and b2 of the third and fourth gate patterns 13 and 14, respectively.

"Gate patterns" in this embodiment are formed of, e.g., polysilicon, and include not only a transistor gate which constitutes a transistor together with a diffusion region, but also a dummy gate which does not constitute a transistor.

As shown in a layout shape in FIG. 1A, the end portion a1 of the first gate pattern 11, the end portion a2 of the second gate pattern 12, the opposite end portion b1 of the third gate pattern 13, and the opposite end portion b2 of the fourth gate pattern 14 are corrected by an OPC. The end portion a2 of the second gate pattern 12 and the opposite end portion b1 of the third gate pattern 13 are corrected by a correction amount g1, and the end portion a1 of the first gate pattern 11 and the opposite end portion b2 of the fourth gate pattern 14 are corrected by a correction amount g2. The correction amount g1 is set to have a larger amount so that the gate pattern does not significantly move back in the first direction when the gate pattern has the finished shape, and the width of the correction amount g1 in the second direction is larger than that of the correction amount g2. By contrast, the width of the correction amount g2 in the second direction is smaller than that of the correction amount g1, allowing the gate pattern to move back to some extent in the first direction.

In FIG. 1A, an extension amount differs between the first and second gate patterns 11 and 12, and positions of the end portions a1 and a2 in the first direction are shifted from each other. The correction amount g2 having a smaller amount is given to the end portion a1 which extends to be positioned closer to the third and fourth gate patterns 13 and 14, and the correction amount g1 having a larger amount is given to the end portion a2 which extends to be positioned farther from the third and fourth gate patterns 13 and 14. Similarly, an extension amount differs between the third and fourth gate patterns 13 and 14, and positions of the opposite end portion b1 and b2 in the first direction are shifted from each other. The correction amount g2 having a smaller amount is given to the end portion b2 which extends to be positioned closer to the first and second gate patterns 11 and 12, and the correction amount g1 having a larger amount is given to the end portion b1 which extends to be positioned farther from the first and second gate patterns 11 and 12. Considering the end portion a1 and the opposite end portion b1 as an end pair, and the end portion a2 and the opposite end portion b2 as an end pair, in each of the end pairs, the end portion which extends to be positioned closer to the corresponding gate patterns has a smaller correction amount, and the end portion which extends to be positioned farther from the corresponding gate patterns has a larger correction amount.

As a result of the OPC, the finished shape as shown in FIG. 1B is obtained. The end portion a2 of the second gate pattern 12 having the larger correction amount g1, and the opposite end portion b1 of the third gate pattern 13 having the larger correction amount g1 hardly move back in the first direction, and they have a shape like a matchstick head (hammerhead shape). By contrast, the end portion a1 of the gate pattern 11 having the smaller correction amount g2 and the opposite end portion b2 of the fourth gate pattern 14 having the smaller correction amount g2 move back in the first direction. In FIG. 1B, the extension amount in the end portion a1 and the opposite end portion b2 is larger than that in the end portion a2 and the opposite end portion b1.

In other words, the end portion a1 of the first gate pattern 11 extends to be positioned closer to the third and fourth gate patterns 13 and 14 than the end portion a2 of the second gate pattern 12 is, and the opposite end portion b2 of the fourth gate pattern 14 extends to be positioned closer to the first and second gate patterns 11 and 12 than the opposite end portion b1 of the third gate pattern 13 is. The end portion a2 of the second gate pattern 12 is formed to be thicker than the end portion a1 of the first gate pattern 11, and the opposite end portion b1 of the third gate pattern 13 is formed to be thicker than the opposite end portion b2 of the fourth gate pattern 14.

If the amount of the moving back of the end portion a1 of the first gate pattern 11 and that of the opposite end portion b2 of the fourth gate pattern 14 are large, the extension amount of the end portion a1 and that of the opposite end portion b2 may be substantially the same as that of the second end portion a2 of the second gate pattern 12 and that of the opposite end portion b1 of the third gate pattern 13.

FIG. 2 is a view showing an example of layouts of the semiconductor device according to the first embodiment. In FIG. 2, a first logic cell 1 and a second logic cell 2 are aligned in the first direction. The characteristics shown in FIG. 1 are obtained in a region 1A, denoted by a dotted line, by a first gate pattern 21, a second gate pattern 22, a third gate pattern 23, and a fourth gate pattern 24. Three or more of the logic cells may be repeatedly arranged in the first direction, and a plurality of logic cell groups in each of which a plurality of the logic cells are arranged may be arranged in the second direction.

Figure 3:
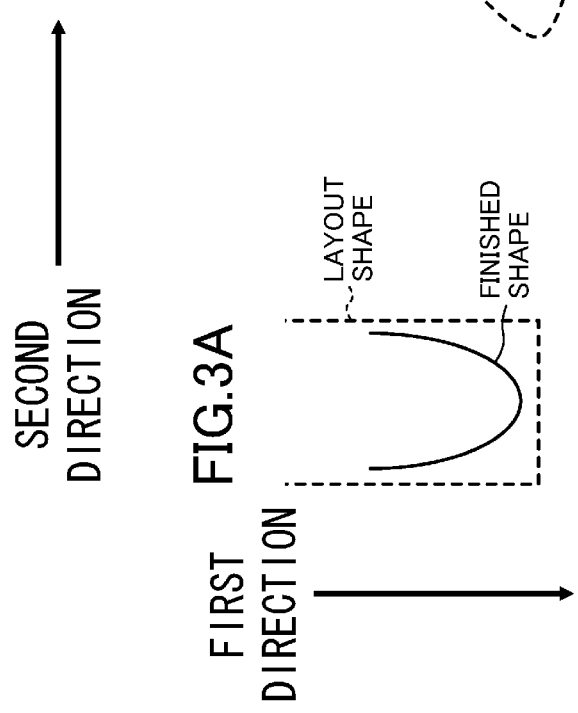
FIGS. 3A-3C are views explaining a relationship between a layout shape and a finished shape of the gate patterns.

The relationship between the layout shape and the finished shape of the gate pattern will be described using FIG. 3. As shown in FIG. 3A, an end portion of a thin line pattern, such as a gate, moves back through a lithography step, an etching step, and etc. When the pattern significantly moves back, a short circuit may occur between a source and a drain of a transistor in the worst case.

In order to avoid the problem, in general, as shown in FIG. 3B, a layout shape has a sufficient width W1 by a mask correction such as an OPC, and etc., in the second direction (the horizontal direction, the gate length direction). This can prevent the significant moving back in the first direction (the vertical direction, the gate width direction). The end portion has a hammerhead shape. By contrast, as shown in FIG. 3C, if a sufficient width cannot be ensured (a width W2) in the second direction, the moving back is allowed to some extent in the first direction.

Figure 4:
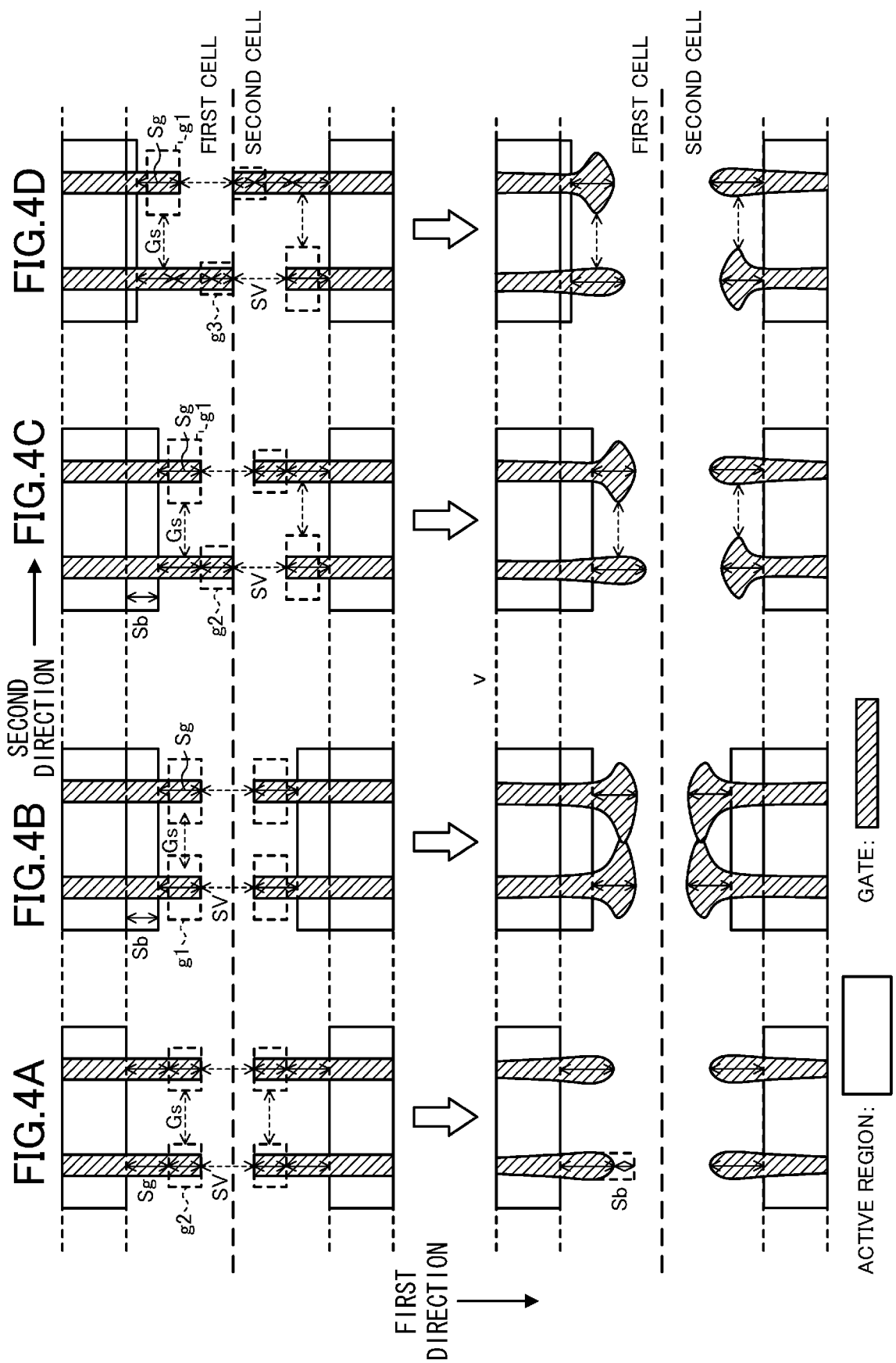
FIGS. 4A-4D are views explaining an advantage of the first embodiment and showing the layout shape and the finished shape of the gate patterns.

An advantage of the embodiment will be described using FIG. 4. The upper part of FIG. 4 shows a layout shape of the gate patterns, and the lower part shows a finished shape of the gate patterns. Sg refers to the minimum length of the end portion of the gate that should extend from the active region, SV refers to the minimum length of a space as a gate space in the first direction, and Gs refers to the minimum length of a space as a gate space in the second direction.

In the example of FIG. 4A, all the end portions of the gate patterns are corrected by the smaller correction amount g2. In this case, each of the end portions in the gate patterns moves back by a length Sb in the first direction. Therefore, the gate space in the first direction is greatly extended from the length SV set in the layout shape. This leads to increase of a circuit area and decline of integration density in the semiconductor device.

In the example of FIG. 4B, all the end portions of the gate patterns are corrected by the larger correction amount g1. In this case, each of the end portions in the gate patterns does not move back in the first direction. However, since the end portion has a hammerhead shape, the gate space cannot be sufficiently ensured in the second direction, and in some cases, a short circuit of the gates may occur. In order to prevent the problem, the gate space has to have a sufficient large size in the second direction in the layout shape. This leads to, as well as the example of FIG. 4A, increase of a circuit area and decline of integration density in the semiconductor device.

By contrast, FIG. 4C shows the first embodiment. In the example of FIG. 4C, the end portion of the gate pattern extending to be positioned closer to the corresponding gate patterns is corrected by the smaller correction amount g2, and the end portion of the gate pattern extending to be positioned farther from the corresponding gate patterns is corrected by the larger correction amount g1. In this case, the end portion corrected by the correction amount g2 moves back to some extent, and the end portion corrected by the correction amount g1 does not move back. In other words, the positions of the end portions of two of the aligned gate patterns are shifted from each other, thereby making it possible to sufficiently correct one of the end portions so that the one end portion does not move back. Therefore, in comparison to the example of FIG. 4A, an larger active region in the same circuit area can be secured in the first direction by length Sb or more, thereby making it possible to improve performance of the transistor. In addition, the gate space is sufficiently ensured in the second direction, and unlike the example of FIG. 4B, a short circuit of the gate patterns does not occur.

As FIG. 4D, the end portion of the gate pattern extending to be positioned closer to the corresponding gate patterns may be corrected by a still smaller correction amount g3 or may not be corrected. In this case, the advantage similar to that in FIG. 4C can also be obtained.

In other words, according to the first embodiment, a layout can be achieved with a smaller circuit area, thereby making it possible to improve integration density of the semiconductor device. The larger active region can be ensured, thereby making it possible to improve the performance of the transistor.

Therefore, an integrated circuit having a higher performance can be achieved with a smaller circuit area.

Second Embodiment

Figure 5:
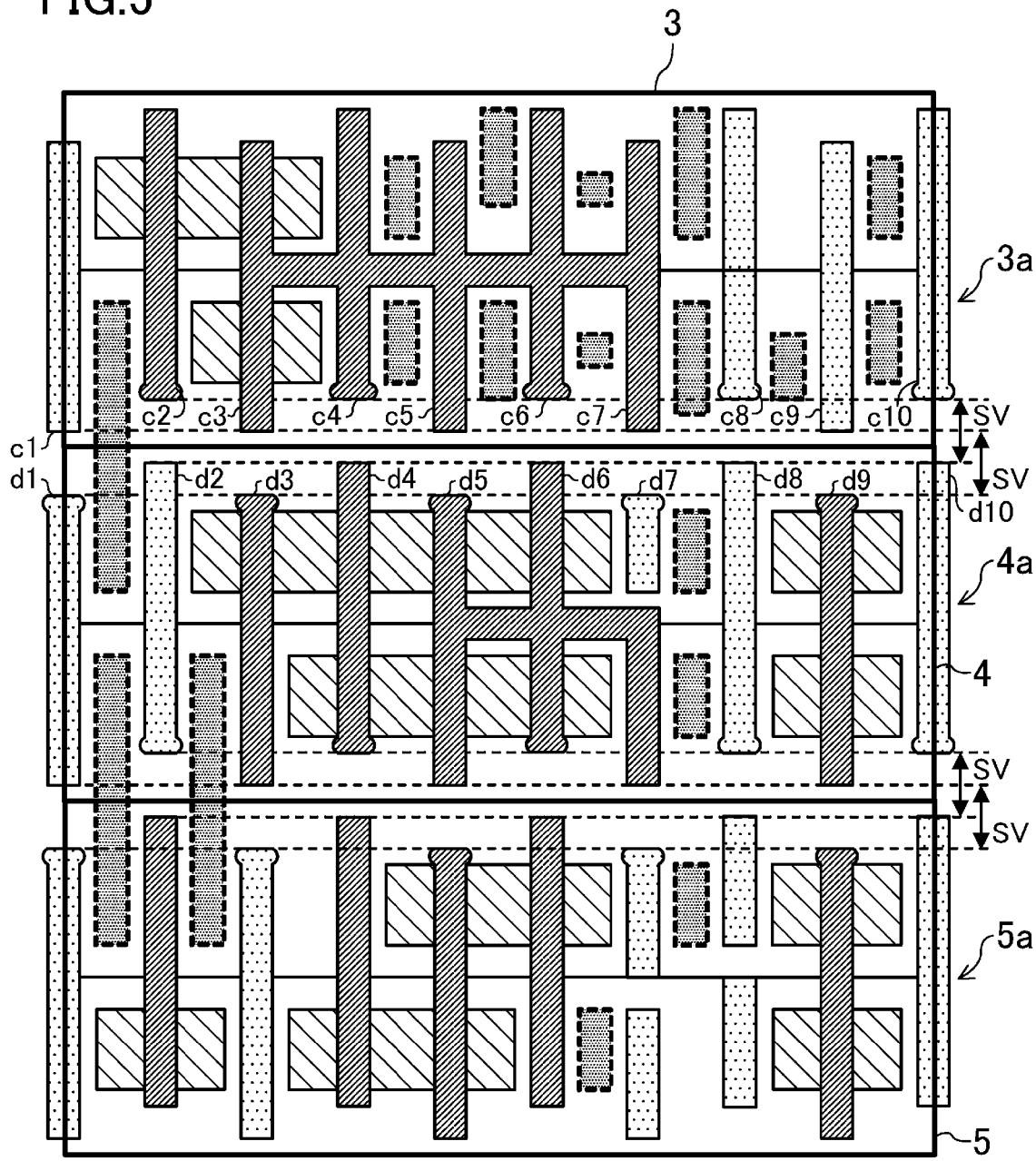
FIG. 5 is a view of an example of layouts of a semiconductor device according to a second embodiment.

FIG. 5 a view of an example of layouts of a semiconductor device according to a second embodiment. In FIG. 5, logic cells 3, 4, and 5 are arranged in a vertical direction (a first direction). Each of the logic cells 3, 4, and 5 has gate groups 3a, 4a, and 5a, respectively, and each of the gate groups has a plurality of gate patterns vertically extending and arranged in a horizontal direction (a second direction orthogonal to the first direction).

Opposite end portions d1-d10 of the respective gate patterns in the gate group 4a are arranged so as to face end portions c1-c10 of the respective gate patterns in the gate group 3a as a first gate group, respectively. The end portions c1, c3, c5, c7, and c9 extend to be positioned closer to the logic cell 4 than the end portions c2, c4, c6, c8, and c10 are. The opposite end portions d2, d4, d6, d8, and d10 extend to be positioned closer to the logic cell 3 than the opposite end portions d1, d3, d5, d7, and d9 are. In other words, end pairs of the end portions c1-c10 and the opposite end portions d1-d10 facing the end portions c1-c10, respectively, are arranged in a staggered manner in the horizontal direction.

In each of the end pairs, one of the end portion and the opposite end portion (the portion which extends to be positioned farther from the corresponding logic cell) is formed to be thicker, and the other (the portion which extends to be positioned closer to the corresponding logic cell) is formed to be thinner. Of the end portions c1-c10, the end portions (end portions c1, c3, c5, c7, and c9), each of which extends to be positioned closer to the opposite end portions d1-d10, are formed to be thinner, and the end portions (end portions c2, c4, c6, c8, and c10), each of which extends to be positioned farther from the opposite end portions d1-d10, are formed to be thicker. Of the opposite end portions d1-d10, the opposite end portions (opposite end portions d2, d4, d6, d8, and d10) which extend to be positioned closer to the end portions c1-c10 are formed to be thinner, and the opposite end portions (opposite end portions d1, d3, d5, d7, and d9) which extend to be positioned farther from the end portions c1-c10 are formed to be thicker.

With such a configuration, as well as the first embodiment, a larger active region can be ensured, thereby making it possible to improve the performance of the transistor, and a layout can be achieved with a smaller circuit area, thereby making it possible to improve integration density of the semiconductor device. Therefore, an integrated circuit having a higher performance can be achieved with a smaller circuit area.

As described in the first embodiment, the thinner end portions c1, c3, c5, c7, and c9 and the thinner opposite end portions d2, d4, d6, d8, and d10 move back further, whereby the extension amount of the end portions and the extension amount of the opposite end portion may be substantially the same as that of the thicker end portions c2, c4, c6, c8, and c10, and that of the thicker opposite end portions d1, d3, d5, d7, and d9.

Figure 6:
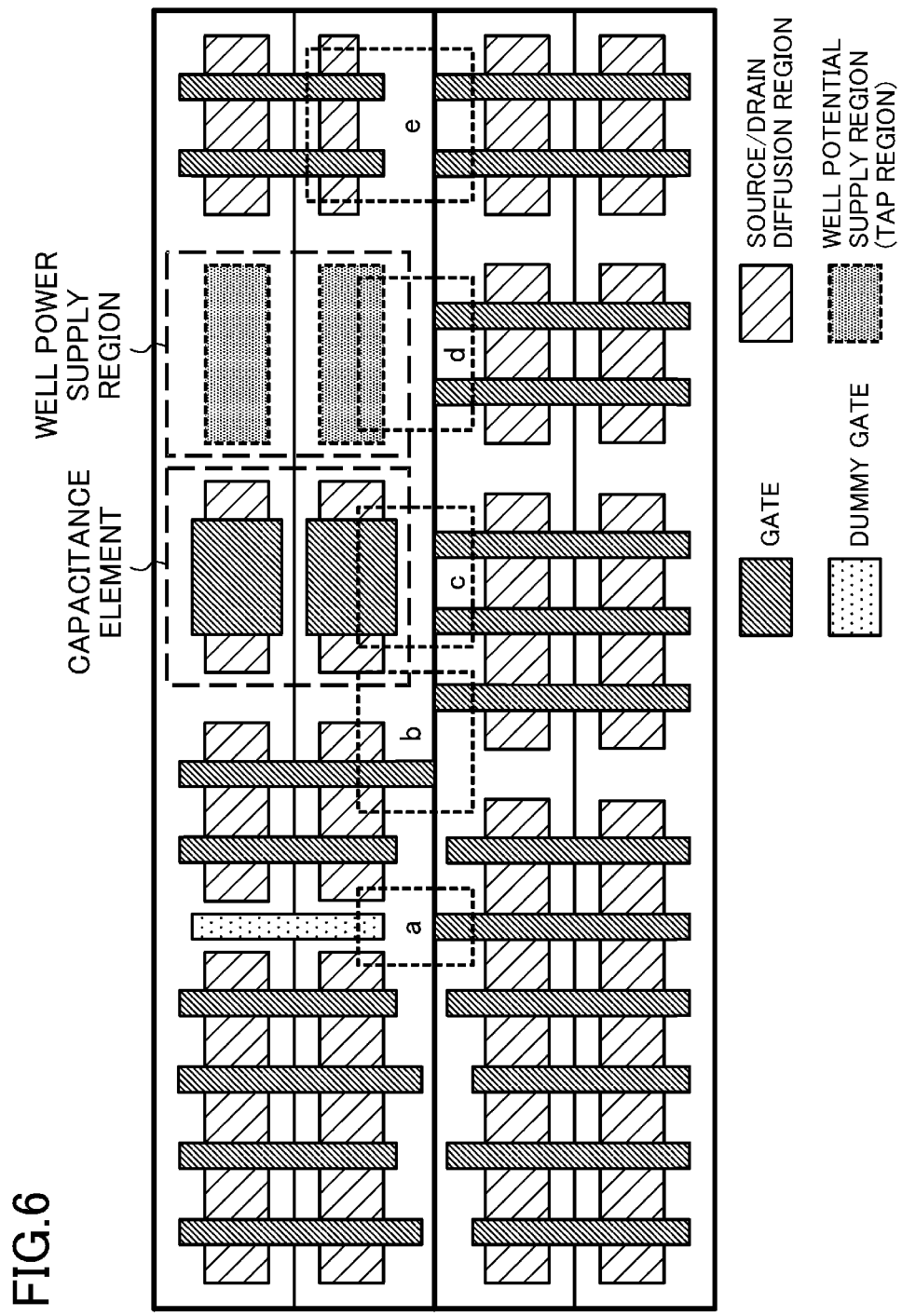
FIG. 6 is a view showing an example in which end pairs are not arranged in a staggered manner.

If the second embodiment is applied to actual gate groups, the end pairs are arranged in a large number of the gate patterns in a staggered manner. However, depending on the structure of the semiconductor device, it is unnecessary to apply the second embodiment, and therefore, in some places, the end pairs may not be continuously arranged in the staggered manner. For example, as shown in FIG. 6, a) when at least one of the gates facing each other is a dummy gate, b) when no gate faces a gate, c) when there is a capacitance element in the opposite direction, d) when there is a well power supply region in the opposite direction, e) when the gate width of the transistor is narrow in the opposite direction, and etc., it is unnecessary to arrange the end pairs in a staggered manner. If the second embodiment is applied to the actual gate groups, at least about 8 or more of the gate patterns may have the end portions arranged in a staggered manner.

Third Embodiment

Figure 7B:
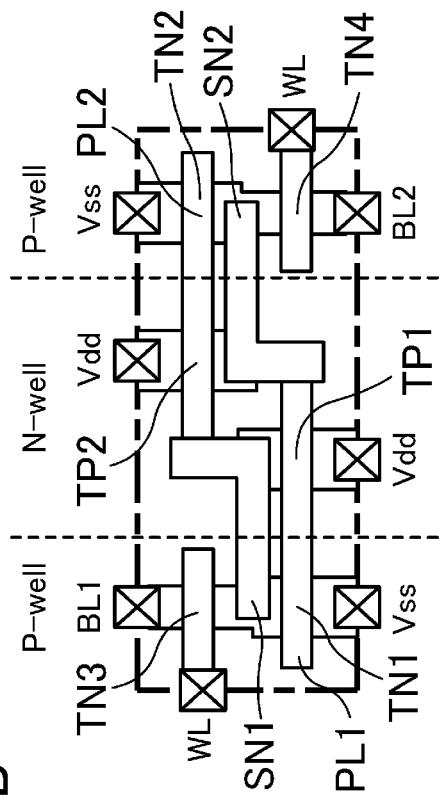
FIGS. 7A-7C are views showing an example in which a third embodiment is applied to a memory cell array.
Figure 7A:
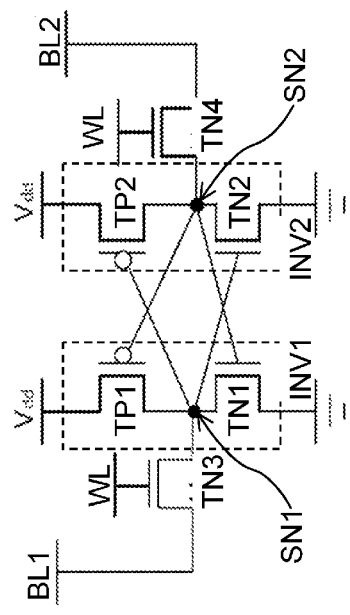

FIG. 7 is a view for explaining a third embodiment, and FIG. 7A illustrates a circuit configuration of a general one-bit memory cell, and FIG. 7B illustrates a layout pattern of the memory cell of FIG. 7A. The memory cell shown in FIGS. 7A and 7B includes load transistors TP1 and TP2 which are PMOS transistors, drive transistors TN1 and TN2 which are NMOS transistors, and access transistors TN3 and TN4 which are NMOS transistors. The gates of the load transistor TP1 and the drive transistor TN1 are connected together, thereby constituting a first inverter INV1. Similarly, the gates of the load transistor TP2 and the drive transistor TN2 are connected together, thereby constituting a second inverter INV2.

A node SN1 between the transistors TN1 and TP1 is connected to the gates of the transistors TN2 and TP2, and a node SN2 between the transistors TN2 and TP2 is connected to the gates of the transistors TN1 and TP1. The drain of the access transistor TN3 is connected to the node SN1, and the source of the access transistor TN3 is connected to a bit line BL1. The drain of the access transistor TN4 is connected to the node SN2, and the source of the access transistor TN4 is connected to a bit line BL2. The gates of the access transistors TN3 and TN4 are connected to a word line WL. PL1 and PL2 refer to a gate electrode.

Figure 7C:
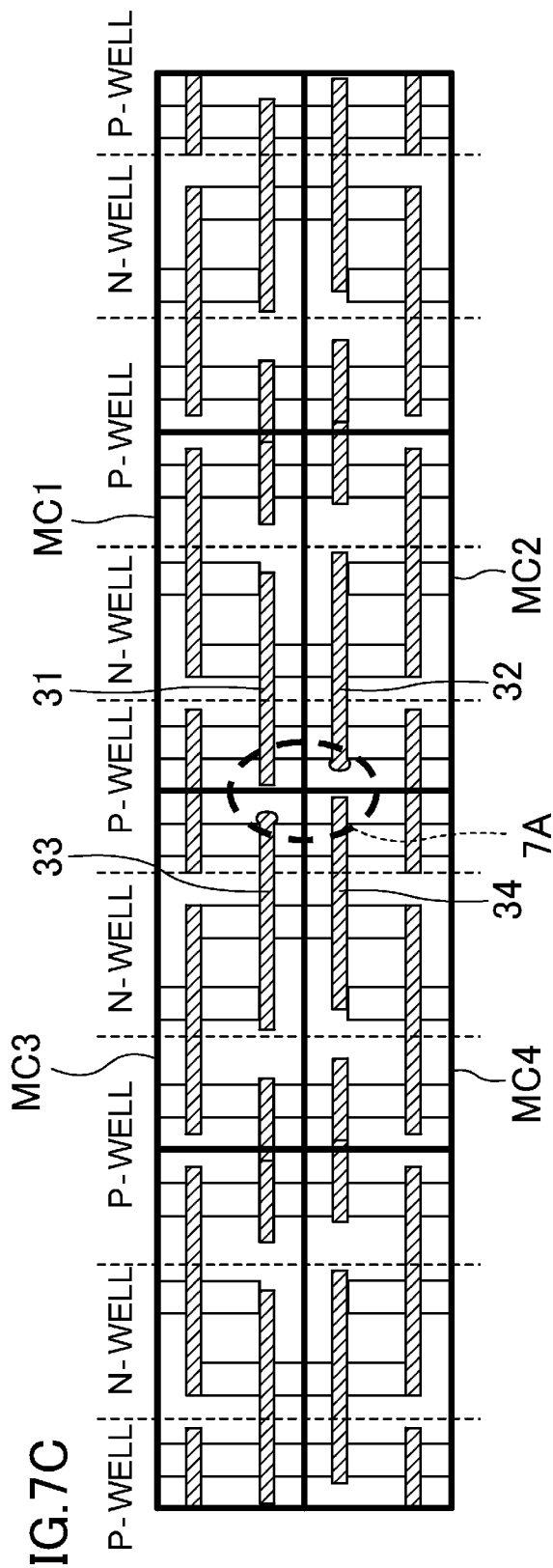

FIG. 7C illustrates an example of layouts of a memory cell array in which a plurality of the memory cells in FIG. 7B are arranged according to the third embodiment. In the layout of FIG. 7C, four columns of the memory cells are arranged in the horizontal direction of the drawing (first direction), and two rows of the memory cells are arranged in the vertical direction of the figure (second direction).

In a region 7A, a first gate pattern 31 of a memory cell MC1 and a second gate pattern 32 of a memory cell MC2 face a third gate patterns 33 of a memory cell MC3 and a fourth gate pattern 34 of a memory cell MC4, respectively, where the characteristics of the gate patterns described in the first embodiment are achieved. The first-fourth gate patterns 31-34 constitute drive transistors of the memory cells MC1-MC4, respectively.

In other words, the end portion of the first gate pattern 31 extends to be positioned closer to the third and fourth gate patterns 33 and 34 than an end portion of the second gate pattern 32 is, and a opposite end portion of the fourth gate pattern 34 extends to be positioned closer to the first and second gate patterns 31 and 32 than a opposite end portion of the third gate pattern 33 is. The end portion of the second gate pattern 32 is formed to be thicker than the end portion of the first gate pattern 31, and the opposite end portion of the third gate pattern 33 is formed to be thicker than the end portion of the fourth gate pattern 34.

If the end portion of the first gate pattern 31 and the opposite end portion of the fourth gate pattern 34 move back further, the extension amount of the end portion and the extension amount of the opposite end portion may be substantially the same as that of the end portion of the second gate pattern 32, and that of the opposite end portion of the third gate pattern 33.

In this way, by applying the third embodiment, integration density of a memory in a predetermined circuit area can also be considerably enhanced. In the memory, multiple memory cells having the identical layout are arranged, and therefore, the advantages of the third embodiment are more significantly obtained in the memory than in the logic cell. Besides, a larger active region of the drive transistor can be ensured, thereby greatly contributing to improvement of the memory.

In the example of FIG. 7C, the third embodiment is applied to the gate patterns which constitute the drive transistor of the memory cell array in which the memory cell of FIG. 7B is used. However, the present invention is not limited to this application. For example, the third embodiment can also be applied to, e.g., a region in which load transistors face each other, a region in which a drive transistor and an access transistor face each other or the like, depending on a layout of a memory cell array, e.g., in the case where the memory cells of FIG. 7B are arranged in a different layout, in the case where memory cells whose layout is different from that of the memory cells of FIG. 7B are arranged, and etc.

If the third embodiment is applied to a structure except the memory cell, e.g., a latch portion in a standard cell, a significant advantage is also obtained.

The present invention can improve integration density of a semiconductor device, and can achieve extension of a gate width of a transistor and increase of a drive current, and for example, the present invention can be used for semiconductor integrated circuits mounted on various electronic devices, and the like.

What is claimed is:

1. A semiconductor device, comprising:
   a first active region;
   a second active region;
   an isolation region between the first active region and the second active region;
   a plurality of first gate patterns that extend in a first direction and are arranged with intervals in a second direction orthogonal to the first direction; and
   a plurality of second gate patterns that extend in the first direction and are arranged with intervals in the second direction, wherein:
   ends of the plurality of first gate patterns are aligned to and face ends of the plurality of second gate patterns, respectively,
   the ends of the plurality of first gate patterns are arranged in a staggered manner in the second direction, and the ends of the plurality of second gate patterns are arranged in a staggered manner in the second direction,
   the plurality of first gate patterns include a first gate pattern and the plurality of second gate patterns include a second gate pattern, the first gate pattern and the second gate pattern being aligned in the first direction so that an end of the first gate pattern faces an end of the second gate pattern,
   the first gate pattern is disposed on the first active region and the isolation region, and the second gate pattern is disposed on the second active region and the isolation region,
   a length in the first direction of the first gate pattern on the isolation region is longer than a length in the first direction of the second gate pattern on the isolation region, and an end portion of the first gate pattern disposed on the isolation region is thinner, in the second direction, than an end portion of the second gate pattern disposed on the isolation region.

2. The semiconductor device of claim 1, wherein:
   the plurality of first gate patterns further include a third gate pattern, and the plurality of second gate patterns further include a fourth gate pattern, the third gate pattern and the fourth gate pattern being aligned in the first direction so that an end of the third gate pattern faces an end of the fourth gate pattern,
   the third gate pattern and the fourth gate pattern are disposed adjacent to the first gate pattern and the second gate pattern in the second direction, respectively,
   the third gate pattern is disposed on the first active region and the isolation region, and the fourth gate pattern is disposed on the second active region and the isolation region,
   a length in the first direction of the third gate pattern on the isolation region is shorter than a length in the first direction of the fourth gate pattern on the isolation region, and
   an end portion of the third gate pattern disposed on the isolation region is thicker, in the second direction, than an end portion of the fourth gate pattern disposed on the isolation region.

3. The semiconductor device of claim 1, wherein a width of the first gate pattern on the first active region and a width of the second gate pattern on the second active region are equal.

4. The semiconductor device of claim 2, wherein a width of the third gate pattern on the first active region and a width of the fourth gate pattern on the second active region are equal.

5. The semiconductor device of claim 1, wherein the plurality of first gate patterns include eight or more of the gate patterns.

6. The semiconductor device of claim 1, wherein the plurality of first gate patterns are included in a logic cell.

7. The semiconductor device of claim 2, wherein the plurality of first gate patterns include eight or more of the gate patterns.

8. The semiconductor device of claim 2, wherein the plurality of first gate patterns are included in a logic cell.

9. The semiconductor device of claim 2, wherein the first to fourth gate patterns constitute drive transistors of memory cells different from one another.

10. A semiconductor device, comprising:
    a first logic cell including a plurality of first gate patterns that extend in a first direction and are arranged with intervals in a second direction orthogonal to the first direction;
    a second logic cell including a plurality of second gate patterns that extend in the first direction and are arranged with intervals in the second direction, wherein:
    the second logic cell is disposed adjacent to the first logic cell in the first direction, so that ends of the plurality of first gate patterns are aligned to and face ends of the plurality of second gate patterns, respectively, and
    end portions of the plurality of first gate patterns and end portions of the plurality of second gate patterns are formed such that:
    when an end of a gate pattern of the plurality of first gate patterns is located closer to a cell boundary of the first logic cell and the second logic cell than an end of a corresponding gate pattern of the plurality of second gate patterns, and an end of an adjacent gate pattern of the plurality of first gate patterns, which is adjacent to the gate pattern of the plurality of first gate patterns, is located farther from the cell boundary than the end of the gate pattern of the plurality of first gate patterns, a width of an end portion of the gate pattern of the plurality of first gate patterns is thinner than a width of an end portion of the corresponding gate pattern of the plurality of second gate patterns, and when the end of the gate pattern of the plurality of first gate patterns is located farther from the cell boundary than the end of the corresponding gate pattern of the plurality of second gate patterns, and the end of the adjacent gate pattern of the plurality of first gate patterns is located closer to the cell boundary than the end of the gate pattern of the plurality of first gate patterns, the width of the end portion of the gate pattern of the plurality of first gate patterns is thicker than the width of the end portion of the corresponding gate pattern of the plurality of second gate patterns.

11. The semiconductor device of claim 10, wherein the ends of the plurality of first gate patterns are arranged in a staggered manner in the second direction, and the ends of the plurality of second gate patterns are arranged in a staggered manner in the second direction.

12. The semiconductor device of claim 10, wherein the end portions of the plurality of first gate patterns are formed such that:

when the end of the gate pattern of the plurality of first gate patterns is located closer to the cell boundary than the end of the corresponding gate pattern of the plurality of second gate patterns, and the end of the adjacent gate pattern of the plurality of first gate patterns is located farther from the cell boundary than the end of the gate pattern of the plurality of first gate patterns, a width of an end portion of the adjacent gate pattern is thicker than the width of the end portion of the gate pattern of the plurality of first gate patterns, and when the end of the gate pattern of the plurality of first gate patterns is located farther from the cell boundary than the end of the corresponding gate pattern of the plurality of second gate patterns, and the end of the adjacent gate pattern of the plurality of first gate patterns is located closer to the cell boundary than the end of the gate pattern of the plurality of first gate patterns, the width of the end portion of the adjacent gate pattern is thinner than the width of the end portion of the gate pattern of the plurality of first gate patterns.

13. A semiconductor device, comprising:

a first logic cell including a plurality of first gate patterns that extend in a first direction and are arranged with intervals in a second direction orthogonal to the first direction;

a second logic cell including a plurality of second gate patterns that extend in the first direction and are arranged with intervals in the second direction, wherein:

the second logic cell is disposed adjacent to the first logic cell in the first direction, so that ends of the plurality of first gate patterns are aligned to and face ends of the plurality of second gate patterns, respectively, the plurality of first gate patterns includes a first gate pattern and a second gate pattern that is adjacent to the first gate pattern in the second direction, an end of the first gate pattern being located closer to a cell boundary of the first logic cell and the second logic cell than an end of the second gate pattern, a width of an end portion of the first gate pattern is thinner than a width of an end portion of the second gate pattern.

14. The semiconductor device of claim 13, wherein:

the plurality of second gate patterns include a third gate pattern, and a fourth gate pattern that is adjacent to the third gate pattern in the second direction, an end of the third gate pattern and an end of the fourth gate pattern are aligned to and face the end of the first gate pattern and the end of the second gate pattern, respectively, the end of the fourth gate pattern is located closer to the cell boundary than the end of the third gate pattern, and a width of an end portion of the fourth gate pattern is thinner than a width of an end portion of the third gate pattern.

15. The semiconductor device of claim 13, wherein the ends of the plurality of first gate patterns are arranged in a staggered manner in the second direction, and the ends of the plurality of second gate patterns are arranged in a staggered manner in the second direction.

* * * * *